(12) United States Patent
Niimi et al.

(10) Patent No.: US 6,362,764 B1
(45) Date of Patent: Mar. 26, 2002

(54) DIGITAL TO ANALOG CONVERSION APPARATUS AND METHOD WITH CROSS-FADING BETWEEN NEW AND OLD DATA

(75) Inventors: Koji Niimi; Ryuuji Wakatsuki; Kiyoto Kuroiwa, all of Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/619,960

(22) Filed: Jul. 20, 2000

(30) Foreign Application Priority Data

Aug. 5, 1999 (JP) ............................................ 11-222807

(51) Int. Cl.⁷ .............................. H03M 1/06; H03M 1/66
(52) U.S. Cl. ...................................... 341/144; 341/118
(58) Field of Search ................................. 341/144, 139, 341/141, 145, 118, 120; 704/200, 201; 381/18; 348/512; 708/490

(56) References Cited

U.S. PATENT DOCUMENTS

| 4,612,627 A | * | 9/1986 | Sugita et al. | 708/490 |
| 4,644,400 A | * | 2/1987 | Kouyama et al. | 348/512 |
| 6,201,490 B1 | * | 3/2001 | Kawano et al. | 341/139 |

FOREIGN PATENT DOCUMENTS

| JP | 6050821 | 6/1994 |
| JP | 7093579 | 10/1995 |
| JP | 1308109 | 11/1999 |

* cited by examiner

*Primary Examiner*—Patrick Wamsley
(74) *Attorney, Agent, or Firm*—Pillsbury Winthrop LLP

(57) ABSTRACT

Most appropriate data of a plurality of level-converted digital data obtained by level conversion of the same input digital data by different conversion factors is selected based on a signal quality of each level-converted digital data. The other level-converted digital data is attenuated to or below a predetermined noise level. Switching between previously selected data and newly selected data is effected by cross-fading. The level-converted digital data are D/A converted to respective analog signals. Level conversion of the analog signals are carried out again based on respective corresponding ones of the conversion factors to restore a level of the input digital data, and all the level-converted analog signals are then added together. When an amplitude level of the input digital data exceeds a predetermined value, the cross-fading is started between the previously selected data and the newly selected data which are delayed by the predetermined amount of delay, and when during the cross-fading a larger rate of change in the amplitude level of the input digital data than a predetermined value is detected, the cross-fading is carried out at a rate larger than a predetermined rate in dependence on the rate of change in the amplitude level. In another form, the cross-fading is started at a first rate when the amplitude level exceeds a first predetermined value, and when during the cross-fading the amplitude level exceeds a second predetermined value larger than the first one, the cross-fading is carried out at a second rate larger than the first rate.

7 Claims, 7 Drawing Sheets

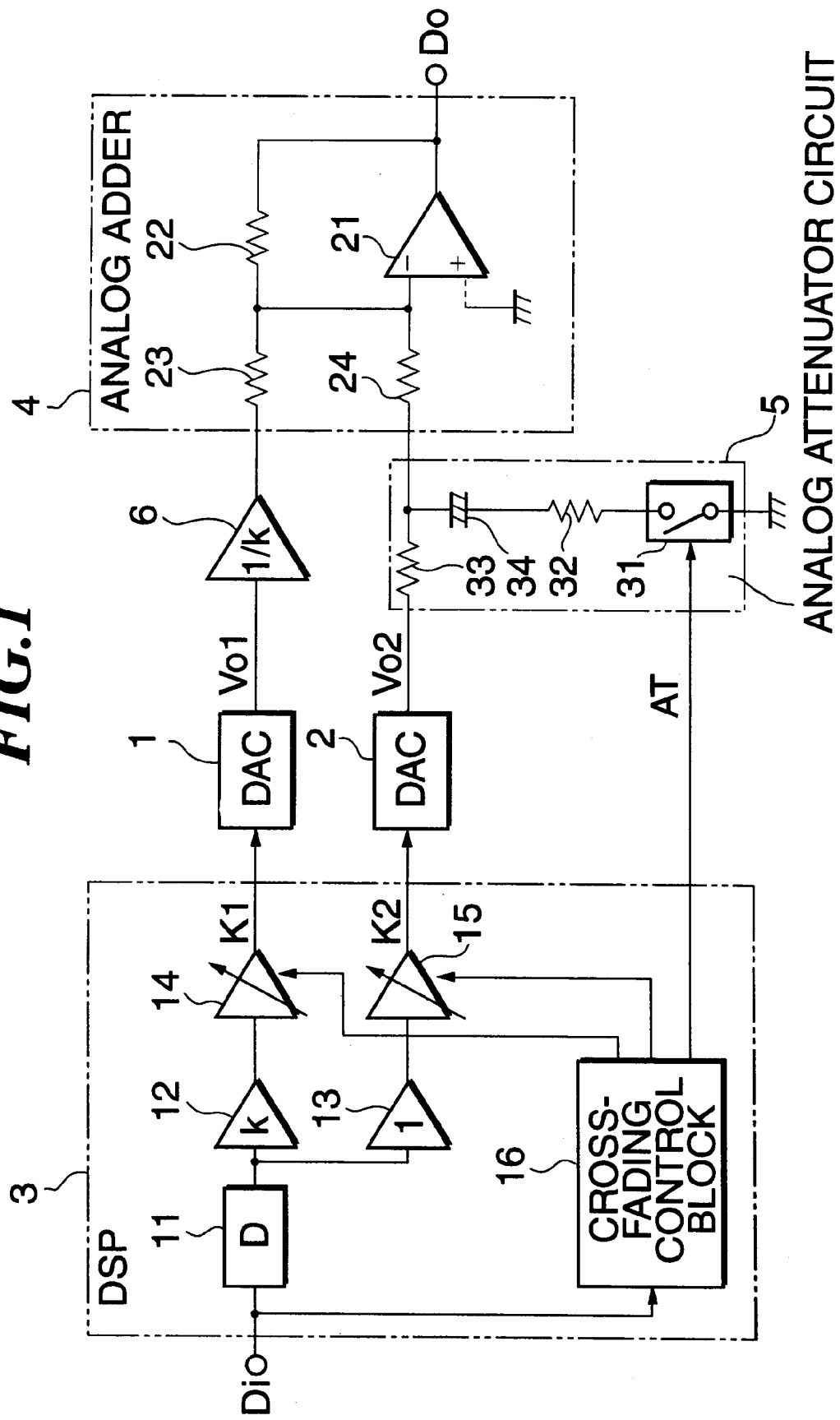

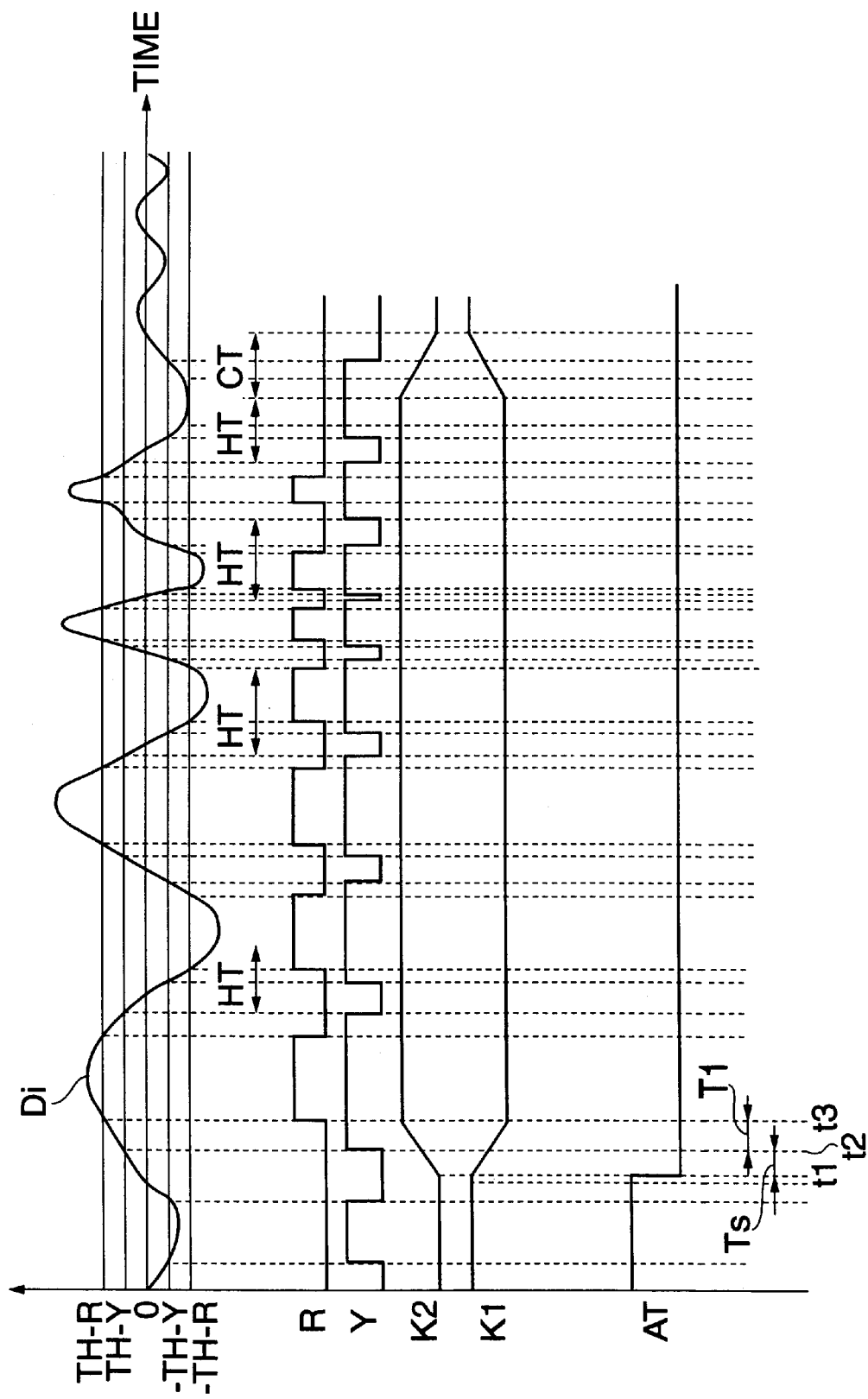

DIGITAL TO ANALOG CONVERSION APPARATUS AND METHOD WITH CROSS-FADING BETWEEN NEW AND OLD DATA

BACKGROUND OF THE INVENTION

1. Field of the Invention

This invention relates to D/A conversion apparatus and method of a floating type which perform level conversion of input digital data by different conversion factors, converts the resulting data into analog data, then restores the analog data to an original level of the input digital data, and carries out addition of the analog data, thereby achieving an increased dynamic range of the reproduced sound.

2. Prior Art

In recent years, the conversion accuracy of A/D converters has been improved by virtue of delta-sigma modulators of higher order, and with this improvement, there is an increasing demand for further enhancement in the resolution and dynamic range of D/A converters. To meet the demand, a D/A conversion apparatus of a floating type has been conventionally developed which uses a D/A converter (hereinafter referred to as the "DAC") having a limited number of bits for conversion, and is capable of realizing a resolution and a dynamic range exceeding respective levels attainable by the limited number of bits for conversion. In this type of converter, when an N-bit (e.g. 20-bit) DAC is used for carrying out D/A conversion of M-bit (M>N: e.g. 24-bit) digital data, if the digital data has P bits (M≧P>N) as effective bits, the digital data is directly subjected to D/A conversion without being further processed, and M−N less significant bits (e.g. four less significant bits) are truncated. On the other hand, if the input level of the digital data lowers so that the effective word length of the same is reduced to P' bits (P'≧N), the digital data is converted into data obtained by multiplying the same by a conversion factor of $2^{M-N}$, i.e. by shifting the original data toward MSB (most significant bit) by M−N bits so that the M−N less significant bits have a value of zero, and then the resulting level-converted data is subjected to D/A conversion. Whether input digital data is to be subjected to D/A conversion without being further processed or after being multiplied by the conversion factor of $2^{M-N}$ is determined depending on whether an overflow of data occurs when the input digital data is shifted by M−N bits.

In the D/A conversion apparatus constructed as above, when input data has P significant bits as effective bits, the length of word or bits for conversion is sufficiently large, so that the effect of the truncation of the M−N less significant bits is almost negligible (even if a problem occurs due to the truncation, it can be solved e.g. by additionally carrying out dithering as required). On the other hand, when the effective bit length of input data is P' bits, the data is multiplied by the conversion factor of $2^{M-N}$, and the M−N less significant bits thereof are truncated during the D/A conversion. Therefore, in this case, M−N less significant bits of the data which would be truncated if the data were not multiplied by the conversion factor of $2^{M-N}$ can be effectively D/A converted, whereby an increased resolution and an increased dynamic range are achieved. In the latter case, however, since an analog signal output from the DAC also has a magnitude multiplied by $2^{M-N}$, it is required to carry out a level adjustment by multiplying the analog output by $1/2^{M-N}$.

The D/A conversion apparatus of the floating type constructed as above includes one which employs a single DAC and the gain of an amplifier that amplifies an output from the single DAC is switched according to the conversion factor by which the level of input digital data is converted, and another which employs a plurality of DAC's that perform D/A conversion of plural pieces of digital data obtained through level conversion of input digital data by respective different conversion factors, and one of the outputs from the DAC's which has been subjected to the level conversion by the most appropriate conversion factor is selected (Japanese Patent Publication (Kokoku) No. 7-93579).

However, according to the former floating-type D/A conversion apparatus, since it is required to switch the gain of the analog amplifier instantaneously according to the level of the digital data, the output of the amplifier cannot follow up the switching, or DC offset of the amplifier can fluctuate, which can produce untoward noise which is audible. The latter floating-type D/A conversion apparatus also switches between analog signals output from the DAC's, so that transient noise occurs upon the switching. These problems are extremely serious particularly when the resolution of digital data to be subjected to D/A conversion covers even a low noise range e.g. an SN ratio of 120 to 140 dB which can be conventionally realized only by analog circuitry.

To solve these problems, the present assignee has already proposed, e.g. in Japanese Laid-Open Patent Publication (Kokai) No. 11-308109, a D/A conversion apparatus of an advanced cross-fading algorithm type that is capable of effectively preventing generation of noise upon the switching between DAC's, by cross-fading the digital data in advance of the switching. This D/A conversion apparatus generates only a very small amount of noise upon the switching between the DAC's and is therefore capable of realizing a high-accuracy D/A conversion, as well as achieving an improved dynamic range.

In this D/A conversion apparatus, the advanced cross-fading operation is made possible by provision of a delay memory for delaying input digital data by a predetermined time period. To reduce the level of noise upon the switching between the DAC's, it is preferred that the cross-fading is carried out at a gentle cross-fading rate (by a small cross-fading step i.e., over a large number of cross-fading steps) or over a sufficiently long time period. However, to realize such a gentle advanced cross-fading without causing overflow and clipping of data even when the level of the digital data steeply changes, the delay memory is required to provide a large amount of delay, which leads to an increased size of hardware, and hence to an increased manufacturing cost. Further, such an increase in the amount of delay results in a perceivable auditory delay, particularly when the D/A conversion apparatus is applied to a mixer that processes data of live sounds, or the like.

SUMMARY OF THE INVENTION

It is an object of the present invention to provide a D/A conversion apparatus and a D/A conversion method of a floating type which are not only capable of low-noise and high-dynamic range D/A conversion but also capable of carrying out the advanced cross-fading at a cross-fading rate sufficiently gentle for practical use by using a delay memory having a small amount of delay.

To attain the above object, according to a first aspect of the invention, there is provided a D/A conversion apparatus comprising a digital signal processor that carries out level conversion of same input digital data by different conversion factors into a plurality of level-converted digital data, selects and outputs most appropriate data of the plurality of level-converted digital data based on a signal quality of each of the plurality of level-converted digital data, outputs other data of the plurality of level-converted digital data after attenuating the other data to or below a predetermined noise level, and switches between data previously selected as the most appropriate data and data newly selected as the most appropriate data by carrying out cross-fading between the previously selected data and the newly selected data, a plurality of D/A converters that carry out D/A conversion of the plurality of level-converted digital data output from the digital signal processor to respective analog signals and outputs the analog signals, and an analog adder device that carries out level conversion of the analog signals output from the plurality of D/A converters again based on respective corresponding ones of the conversion factors in a manner such that resulting analog signals have a level corresponding to a level of the input digital data, and then adds together all of the level-converted analog signals.

The D/A conversion apparatus according to the first aspect of the invention is characterized in that the digital signal processor comprises a cross-fading section that carries out cross-fading between the previously selected data and the newly selected data, a delay section that delays the input digital data by a predetermined amount of delay which is shorter than a time period required for completion of the cross-fading carried out at a predetermined cross-fading rate by the cross-fading section, and a cross-fading control section that controls the cross-fading section such that when an amplitude level of the input digital data exceeds a predetermined threshold value, the cross-fading section starts the cross-fading at the predetermined cross-fading rate between the previously selected data and the newly selected data which are delayed by the predetermined amount of delay by the delay section, and that when during the cross-fading a rate of change in the amplitude level of the input digital data, which is larger than a predetermined rate of change, is detected, the cross-fading section carries out the cross-fading at a cross-fading rate larger than the predetermined cross-fading rate in dependence on the rate of change in the amplitude level of the input digital data.

According to this D/A conversion apparatus, when the amplitude level of the input digital data is increasing or decreasing, cross-fading (advanced cross-fading) is carried out between level-converted digital data based on a predetermined amount of delay shorter than a time period required for completion of the cross-fading carried out at a predetermined cross-fading rate. When the amplitude level of the input digital data increases at a gentle rate, the cross-fading is completed in the time period required for completion of the cross-fading without causing an overflow or clipping of data. Further, it is determined whether or not that a rate of change in the amplitude level of the input digital data is larger than a predetermined rate, and when it is determined that the rate of change in the amplitude level of the input digital data is larger than the predetermined rate, the cross-fading rate is increased in dependence on the rate of change in the amplitude level, such that an overflow or clipping of selected level-converted digital data can be prevented.

According to this D/A conversion apparatus, while the cross-fading can be carried out at a sufficiently gentle cross-fading rate for prevention of noise due to gain discrepancies upon switching between gains, the amount of delay provided by the delay section can be sufficiently reduced. This makes it possible to reduce the capacity of the delay memory to simplify the construction of the apparatus and reduce the manufacturing cost. Further, the cross-fading coefficient can be changed in a manner adapted to a larger rate of change in the amplitude level of the input digital data. In this case, the noise-eliminating effect by the cross-fading is degraded. However, since the input signal itself is rapidly changing, the auditory masking effect makes the noise practically imperceptible.

To attain the above object, according to a second aspect of the invention, there is provided a D/A conversion apparatus comprising a digital signal processor that carries out level conversion of same input digital data by different conversion factors into a plurality of level-converted digital data, selects and outputs most appropriate data of the plurality of level-converted digital data based on a signal quality of each of the plurality of level-converted digital data, outputs other data of the plurality of level-converted digital data after attenuating the other data to or below a predetermined noise level, and switches between data previously selected as the most appropriate data and data newly selected as the most appropriate data by carrying out cross-fading between the previously selected data and the newly selected data, a plurality of D/A converters that carry out D/A conversion of the plurality of level-converted digital data output from the digital signal processor to respective analog signals and outputs the analog signals, and an analog adder device that carries out level conversion of the analog signals output from the plurality of D/A converters again based on respective corresponding ones of the conversion factors in a manner such that resulting analog signals have a level corresponding to a level of the input digital data, and then adds together all of the level-converted analog signals.

The D/A conversion apparatus according to the second aspect of the invention is characterized in that the digital signal processor comprises a cross-fading section that carries out cross-fading between the previously selected data and the newly selected data, a delay section that delays the input digital data by a predetermined amount of delay which is shorter than a time period required for completion of the cross-fading carried out at a first predetermined cross-fading rate by the cross-fading section, and a cross-fading control section that controls the cross-fading section such that when an amplitude level of the input digital data exceeds a first predetermined threshold value, the cross-fading section starts the cross-fading at the first predetermined cross-fading rate between the previously selected data and the newly selected data which are delayed by the predetermined amount of delay by the delay section, and that when during the cross-fading the amplitude level of the input digital data exceeds a second predetermined threshold value larger than the first predetermined threshold value, the cross-fading section carries out the cross-fading at a second predetermined cross-fading rate larger than the first predetermined cross-fading rate.

The D/A conversion apparatus according to the second aspect of the invention provides the same effects as obtained by the D/A conversion apparatus according to the first aspect of the invention.

Preferably, the second predetermined threshold value is set to a limit of the amplitude level of the input digital data beyond which an overflow occurs when level conversion is carried out on the input digital data by a corresponding one of the different conversion factors, and the second cross-fading rate is set such that the cross-fading is completed in a time period corresponding to the predetermined amount of delay provided by the delay section.

According to this preferred embodiment, it is possible to secure a longer time period for the cross-fading at the first cross-fading rate, and at the same time, the second cross-fading rate can be set to a slowest rate within the limit defined by the predetermined amount of delay.

More preferably, the cross-fading is carried out using a cross-fading coefficient, the time period required for completion of the cross-fading carried out at the first predetermined cross-fading rate is a time period required for processing of N1 samples of the input digital data, and the predetermined amount of delay provided by the delay section corresponds to a time period required for processing of N2 samples of the input digital data (N1>N2). The cross-fading coefficient is incremented/decremented by 1/N1 for each step of the cross-fading, after the amplitude level of the input digital data exceeds the first threshold value and before the amplitude level of the input digital data exceeds the second predetermined threshold value, and the cross-fading coefficient is incremented/decremented by (1−K)/N2 for each step of the cross-fading, after the amplitude level of the input digital data exceeds the second predetermined threshold value, wherein K represents a value of the cross-fading coefficient assumed at a time point the amplitude level of the input digital data exceeds the second threshold value.

To attain the above object, according to a third aspect of the invention, there is provided a D/A conversion method comprising the steps of: delaying input digital data by a predetermined amount of delay which is shorter than a time period required for completion of cross-fading carried out at a predetermined cross-fading rate; carrying out level conversion of the delayed input digital data by different conversion factors into a plurality of level-converted digital data; selecting and outputting most appropriate data of the plurality of level-converted digital data based on a signal quality of each of the plurality of level-converted digital data, and outputting other data of the plurality of level-converted digital data after attenuating the other data to or below a predetermined noise level; switching between data previously selected as the most appropriate data of the plurality of level-converted digital data and data newly selected as the most appropriate data by carrying out the cross-fading between the previously selected data and the newly selected data; carrying out D/A conversion of the plurality of level-converted digital data to respective analog signals and outputting the analog signals; and carrying out level conversion of the analog signals again based on respective corresponding ones of the conversion factors in a manner such that resulting analog signals have a level corresponding to a level of the input digital data, and then adding together all of the level-converted analog signals; wherein when an amplitude level of the input digital data exceeds a predetermined threshold value, the cross-fading is started between the previously selected data and the newly selected data which are delayed by the predetermined amount of delay, and when during the cross-fading a rate of change in the amplitude level of the input digital data, which is larger than a predetermined rate of change, is detected, the cross-fading is carried out at a cross-fading rate larger than the predetermined cross-fading rate in dependence on the rate of change in the amplitude level of the input digital data.

The D/A conversion method according to the third aspect of the invention provides the same effects as obtained by the D/A conversion apparatus according to the first aspect of the invention.

To attain the above object, according to a fourth aspect of the invention, there is provided a D/A conversion method comprising the steps of: delaying input digital data by a predetermined amount of delay which is shorter than a time period required for completion of cross-fading carried out at a first predetermined cross-fading rate; carrying out level conversion of the delayed input digital data by different conversion factors into a plurality of level-converted digital data; selecting and outputting most appropriate data of the plurality of level-converted digital data based on a signal quality of each of the plurality of level-converted digital data, and outputting other data of the plurality of level-converted digital data after attenuating the other data to or below a predetermined noise level; switching between data previously selected as the most appropriate data of the plurality of level-converted digital data and data newly selected as the most appropriate data by carrying out the cross-fading between the previously selected data and the newly selected data; carrying out D/A conversion of the plurality of level-converted digital data to respective analog signals and outputting the analog signals; and carrying out level conversion of the analog signals again based on respective corresponding ones of the conversion factors in a manner such that resulting analog signals have a level corresponding to a level of the input digital data, and then adding together all of the level-converted analog signals; wherein when an amplitude level of the input digital data exceeds a first predetermined threshold value, the cross-fading is started at the first predetermined cross-fading rate between the previously selected data and the newly selected data which are delayed by the predetermined amount of delay, and when during the cross-fading the amplitude level of the input digital data exceeds a second predetermined threshold value larger than the first predetermined threshold value, the cross-fading is carried out at a second predetermined cross-fading rate larger than the first predetermined cross-fading rate.

The D/A conversion method according to the fourth aspect of the invention provides the same effects as obtained by the D/A conversion apparatus according to the second aspect of the invention.

The above and other objects, features and advantages of the invention will become more apparent from the following detailed description taken in conjunction of the accompanying drawings.

BRIEF DESCRIPTION OF THE DRAWINGS

FIG. 1 is a circuit diagram showing the construction of a D/A conversion apparatus according to an embodiment of the present invention;

FIG. 2 is a timing chart which is useful in explaining the operation of the D/A conversion apparatus of FIG. 1;

DETAILED DESCRIPTION

Figure 3A:
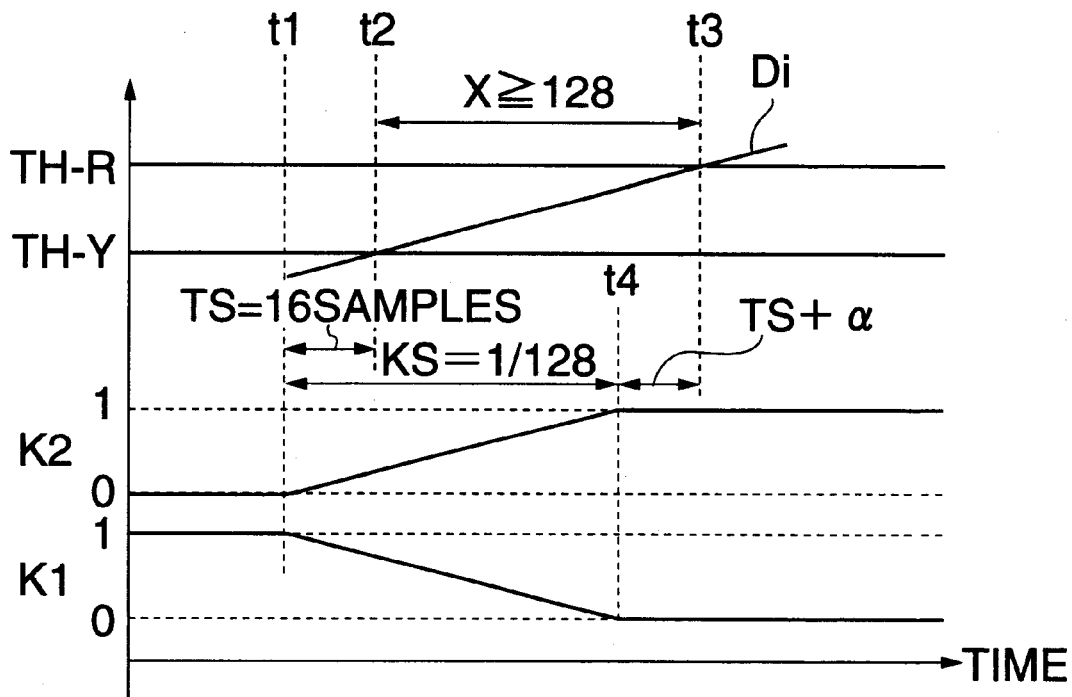
FIG. 3A is a timing chart which is useful in explaining the operation of the D/A conversion apparatus of FIG. 1 in further detail.

The present invention will now be described in detail with reference to drawings showing preferred embodiments thereof.

FIG. 1 shows the whole arrangement of a D/A conversion apparatus according to an embodiment of the present invention.

This apparatus is comprised of two D/A conversion systems, i.e. a first D/A conversion system provided with a first DAC 1 having an N-bit conversion accuracy and a second D/A conversion system provided with a second DAC 2 also having an N-bit (e.g. 24-bit) conversion accuracy. At an upstream stage of the DAC's, there is arranged a digital signal processing circuit, or more specifically, a digital signal processor (hereinafter referred to as "the DSP") 3. The DSP 3 is comprised of a delay circuit 11 for delaying input digital data Di having M (e.g. 27) (M>N) effective bits as a common input by a predetermined time period TS (a time period required for processing e.g. 16 samples of data), a multiplier 12 connected to the delay circuit 11, for multiplying an output from the delay circuit 11 by a factor of k and supplying the same to the DAC 1, another multiplier 13 connected to the delay circuit 11, for directly passing an output from the delay circuit 11 therethrough to the DAC 2, and a pair of cross-faders 14, 15 interposed, respectively, between the multiplier 12 and the DAC 1 and between the multiplier 13 and the DAC 2, which serve as digital attenuation means for selectively attenuating the outputs from the respective multipliers 12, 13 to a value equal to or lower than a noise level of the DAC 1 or 2 as well as for multiplying the outputs by respective coefficients K1, K2 (K1+K2=1) so as to carry out cross-fading when switching is carried out between the outputs to be attenuated. Further, the DSP 3 includes a cross-fading control block 16 which is connected to the cross-faders 14, 15, as well as to an analog attenuator circuit 5, referred to hereinafter. The cross-fading control block 16 senses a level of the input digital data Di to compare the same with two predetermined threshold values, i.e. a first threshold value TH-Y and a second threshold value TH-R, and then controls the switching of the cross-faders, 14, 15 and the operation of the analog attenuator circuit 5.

When the amplitude level of the input digital data Di is equal to or lower than the first threshold value TH-Y, i.e., if the level of the input data Di does not exceed the maximum amplitude that can be expressed by N bits, the cross-fading control block 16 sets the coefficients K1 and K2 to 1 and 0, respectively, whereas if the amplitude level of the input digital data Di rises above or exceeds the first threshold value TH-Y, the cross-fading control block 16 controls the cross-faders 14, 15 such that they start cross-fading at a predetermined cross-fading rate, and if the same exceeds the second threshold value TH-R, it controls the cross-faders 14, 15 such that the cross-fading operation is completed in a time period required for processing 16 samples of data stored in the delay circuit 11, and thereafter the coefficients K1 and K2 are held at 0 and 1, respectively.

An analog signal Vo1 output from the DAC 1 is attenuated by the factor of 1/k by an attenuater 6 connected thereto and then input to one input of an analog adder 4, while an analog signal Vo2 output from the DAC 2 is input as it is, to the other input of the analog adder 4 via the analog attenuator circuit 5. The analog adder 4 may be implemented by an inverting amplifier comprised of an operational amplifier 21, a feedback resistance 22, and input resistances 23, 24, and adds the analog input signals Vo1/k and Vo2. The analog attenuator circuit 5 is connected between the DAC 2 and the analog adder 4. The analog attenuator circuit 5 may be implemented by a low-pass filter circuit comprised of an analog switch 31 which is connected to the cross-fading control block 16 and having one end thereof grounded, and which is turned on in response to an attenuation-instructing signal AT output from the cross-fading control block 16 before the DAC 2 starts to receive digitally attenuated data i.e. data of "0" from the cross-fader 15, a resistance 32 connected to the other end of the switch 31, a resistance 33 connected to the DAC 2, and a capacitor 34 connected between the resistances 33 and 34 with a junction of the capacitor 34 with the resistance 33 connected to the input resistance 24 of the analog adder 4.

The output Vo from the analog adder 4 in the D/A conversion apparatus configured as above is expressed by the following equation (1):

$$Vo = Vo1/k + Vo2 \tag{1}$$

If original conversion outputs from the respective DAC's 1, 2 obtained when the digital data Di is input are represented respectively by DAC1(Di) and DAC2(Di), and residual noises by VN1 and VN2, the outputs Vo1 and Vo2 from the respective DAC's 1, 2 are expressed by the following equations (2a) and (2b), respectively:

$$Vo1 = k \times DAC1(Di) + VN1 \tag{2a}$$

$$Vo2 = DAC2(Di) + VN2 \tag{2b}$$

Consequently, the output Vo from the analog adder 4 is expressed by the following equation (3):

$$Vo = DAC1(Di) + DAC2(Di) + VN1/k + VN2 \tag{3}$$

Here, the DSP 3 selects one of the conversion outputs DAC1(Di) and DAC2(Di) which consists of more effective bits without an overflow, i.e. which can ensure a more excellent signal quality, and therefore the output Vo is further expressed by the following equation (4):

$$Vo = DAC(Di) + VN1/k + VN2 \tag{4}$$

As is apparent from the equation (4), the noise VN1 output from the DAC 1 is reduced to 1/k, whereas the noise VN2 from the DAC 2 is not reduced, so that the noise floor is determined by the residual noise in the DAC 2. Now, let it be assumed that digital data that is input is formed of 27 bits (M=27) and the DAC's 1, 2 each have a 24-bit conversion accuracy (N=24), i.e. are capable of converting 24 bits. In this case, when the DAC 2 is in operation, since no more than 24 bits of the entire data can be converted, it is impossible to reduce the noise floor to less than a value corresponding to the dynamic range of 144 dB. On the other hand, when the DAC 1 is in operation, it is possible to convert the entire 27-bit data, and therefore the dynamic range can be increased to the proper dynamic range of 162 dB. However, if the residual noise from the DAC 2 is added, it is impossible to reduce the noise floor to less than the value corresponding to the dynamic range of 144 dB. To solve this problem, in the apparatus according to the present embodiment, when the DAC 1 is selected for operation, the attenuation-instructing signal AT is delivered to the analog attenuator circuit 5 to turn it on. As a result, the noise floor during the operation of the DAC 1 is reduced, whereby the dynamic range is increased to the proper dynamic range of 162 dB.

If the input impedance of the operational amplifier 21 changes in dependence on whether the analog attenuator circuit 5 is ON or OFF, the gain of the analog adder 4 changes, which causes fluctuation in output offset voltage of the operational amplifier 21. In general, the amount of offset variation at the output of an operational amplifier is approximately 0.5 mV, which is a very large value when considered in comparison with the resolution of a DAC, which has a noise level of several $\mu$volts (in a 24-bit DAC, 1 LSB ≈ 0.6 $\mu$VRMS). To solve the problem, according to the present embodiment, the analog attenuator circuit 5 is formed of a low-pass filter circuit for attenuating only medium-to-high frequency range components of the analog signal from the DAC 2, whereby the direct current input impedance of the analog adder 4 is prevented from fluctuating due to the ON/OFF operations of the analog attenuator circuit 5.

Referring to FIG. 2, there are shown changes in the level of input digital signal Di and the level of the attenuation-instructing signal AT together with timing of switching performed between the DAC's 1, 2 within the DSP 3.

Switching between the DAC's 1, 2 is carried out in a progressive manner, i.e., through cross-fading so as to prevent transient distortion of the output analog signal, insufficient response to the input digital signal, and occurrence of hop noise, etc. In the following, the cross-fading carried out in switching from the DAC 1 to the DAC 2 cases will be mainly described.

First, in the case of switching from the DAC 1 to the DAC 2, as shown in FIG. 2, when the amplitude level of the input digital data Di exceeds the first threshold value TH-Y at a time point t2, the cross-facing is started at a time point t1 earlier than the time point t2 by a time period TS corresponding to a processing time of 16 samples of data stored in the delay circuit 11. During the cross-fading, the cross-fading coefficients K1, K2 are changed at a first predetermined cross-fading rate, e.g. 1/128 per step. Then, if the cross-fading is not completed at a time point t3 the amplitude level of the input digital data Di exceeds the second threshold value TH-R, the cross-fading is continued at a second cross-fading rate such that the cross-fading is completed in a time period required for processing 16 samples of data currently stored in the delay circuit 11.

Figure 3B:
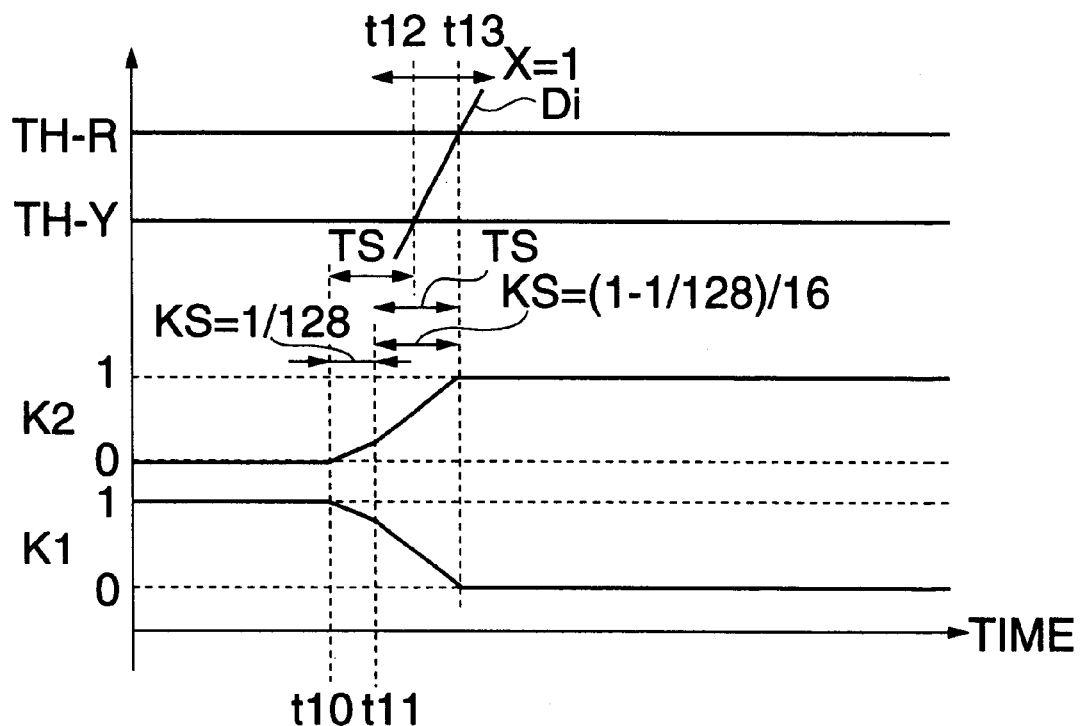
FIG. 3B is a timing chart similar to FIG.3A.
Figure 3C:
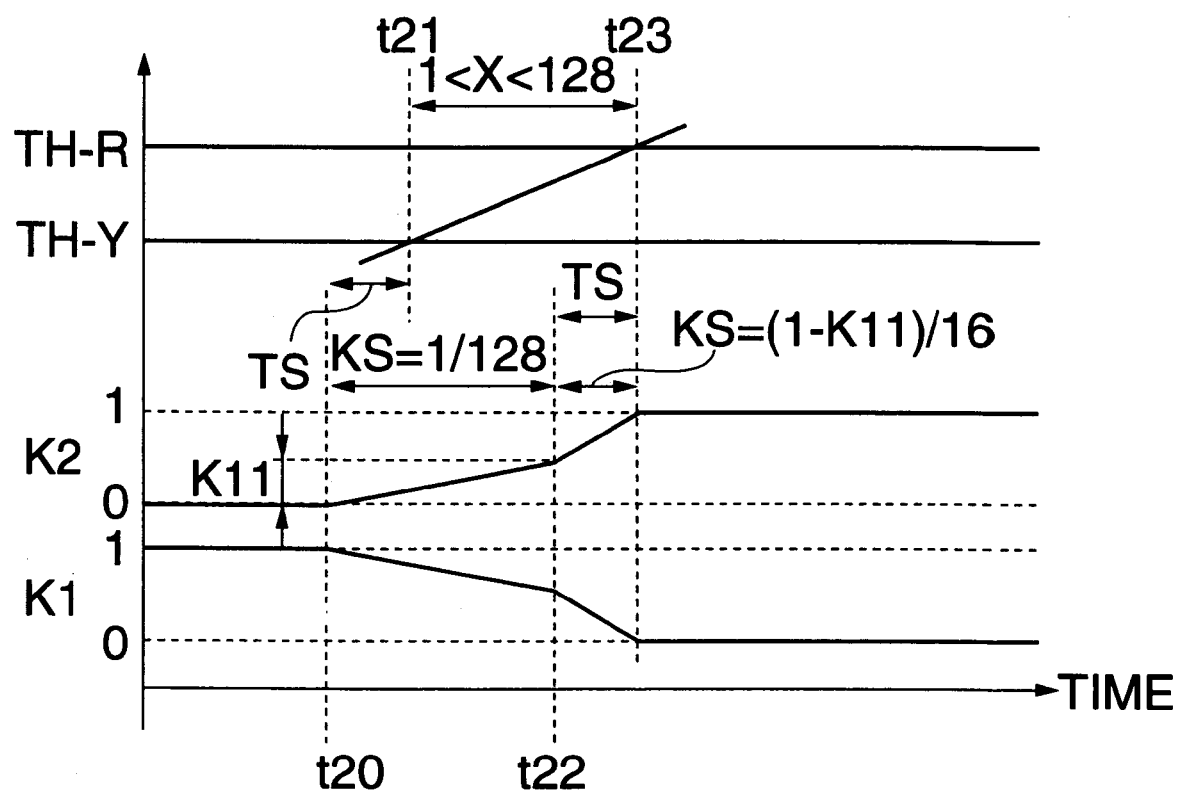
FIG. 3C is a timing chart similar to FIG.3A.

FIGS. 3A to 3C show timing charts useful in explaining the cross-fading operation in further detail.

FIG. 3A shows a case in which the amplitude level of the input digital data Di changes at a gentle rate, and the number X of samples of the input digital data Di processed between the time point t2 the amplitude level exceeds the first threshold value TH-Y and the time point t3 the same exceeds the second threshold value TH-R is equal to or more than 128. In this case, at or before the time point t3 the amplitude level of the input digital data Di exceeds the second threshold value TH-R, the cross-fading of data delivered from the delay circuit 11, which is started at the time point t1 earlier than the time point t2 by the time period TS, is completed, so that the whole cross-fading process is completed over 128 steps, i.e. carried out at the first cross-fading rate KS=1/128 per step.

FIG. 3B shows a case in which the amplitude level of the input digital data Di rises at a steep rate. In the illustrated example, the number X of samples of the input digital data Di processed between a time point t12 the amplitude level exceeds the first threshold value TH-Y and a time point t13 the same exceeds the second threshold value TH-R is equal to 1. In this case, the cross-fading is carried out on one sample of data at the first cross-fading rate KS=1/128 per step, starting at a time point t10 earlier than the time point t12 by the time period TS, but the amplitude level of the input digital data Di immediately exceeds the second threshold value TH-R, and hence the cross-fading rate is changed to the second cross-fading rate KS=(1−1/128)/16 per step, to carry out a rapid cross-fading operation starting at a time point t11 earlier than the time point t13 by the time period TS, whereby the cross-fading is completed before the level of the input digital data Di exceeds the second threshold value TH-R, so that clipping of data can be prevented. It should be noted that due to the rapid cross-fading, the gain difference or discontinuity partially becomes noticeable to generate a certain level of switching noise. However, since the input digital data Di itself undergoes a rapid change, the auditory masking effect makes the noise practically imperceptible.

FIG. 3C shows a case in which the number X of samples of the input digital data Di processed between a time point t21 the amplitude level exceeds the first threshold value TH-Y and a time point t23 the same exceeds the second threshold value TH-R is larger than 1 but smaller than 128 (1<X<128). First, the cross-fading rate KS is set to the first cross-fading rate 1/128 per step, and the cross-fading is started from a time point t20 earlier than the time point t21 by the time period TS corresponding to the capacity (16 samples) of the delay circuit 11. The input digital data Di exceeds the second threshold value TH-R only after a certain considerable time period during which the cross-fading is continued at the cross-fading rate of 1/128 per step. Thus, during this time period, the cross-fading is carried out at a gentle cross-fading rate, i.e. by a small cross-fading step, so that noise is hardly generated. Thereafter, when the input digital data Di exceeds the second threshold value TH-R, the cross-fading rate KS is changed to the second cross-fading rate of (1−K11)/16 per step, wherein K11 designates a value of the cross-fading coefficient K2 assumed at the time of change of the cross-fading rate.

The above-described method of the cross-fading makes it possible to reduce the capacity of the memory of the delay circuit 11 by minimizing the amount of delay to be provided by the delay circuit 11. Further, appropriate cross-fading can be carried out. in a manner properly responsive to changes in the amplitude level of the input digital data Di.

Next, when the DAC 2 is switched over to the DAC 1, as shown in FIG. 2, the switching is not immediately carried out even when the amplitude level of the input digital data Di becomes lower than the first threshold value TH-Y, but the switching is carried out only when the amplitude level remains lower than the first threshold value TH-Y even after the lapse of a predetermined hold time HT. This prevents frequent switching of the DAC's in response to a large-amplitude signal which only regularly crosses the zero level, and generation of noises resulting from such unnecessary switching operations.

It should be note that if the difference (M−N) in the signal quality between the DAC's 1 and 2 is 3 bits, the second threshold value TH-R may be set to −18 dB corresponding to the 3 bits, but, to provide some margins, the first threshold value TH-Y may be set to −24 dB, and the second threshold value TH-R to −19 dB.

Figure 4:
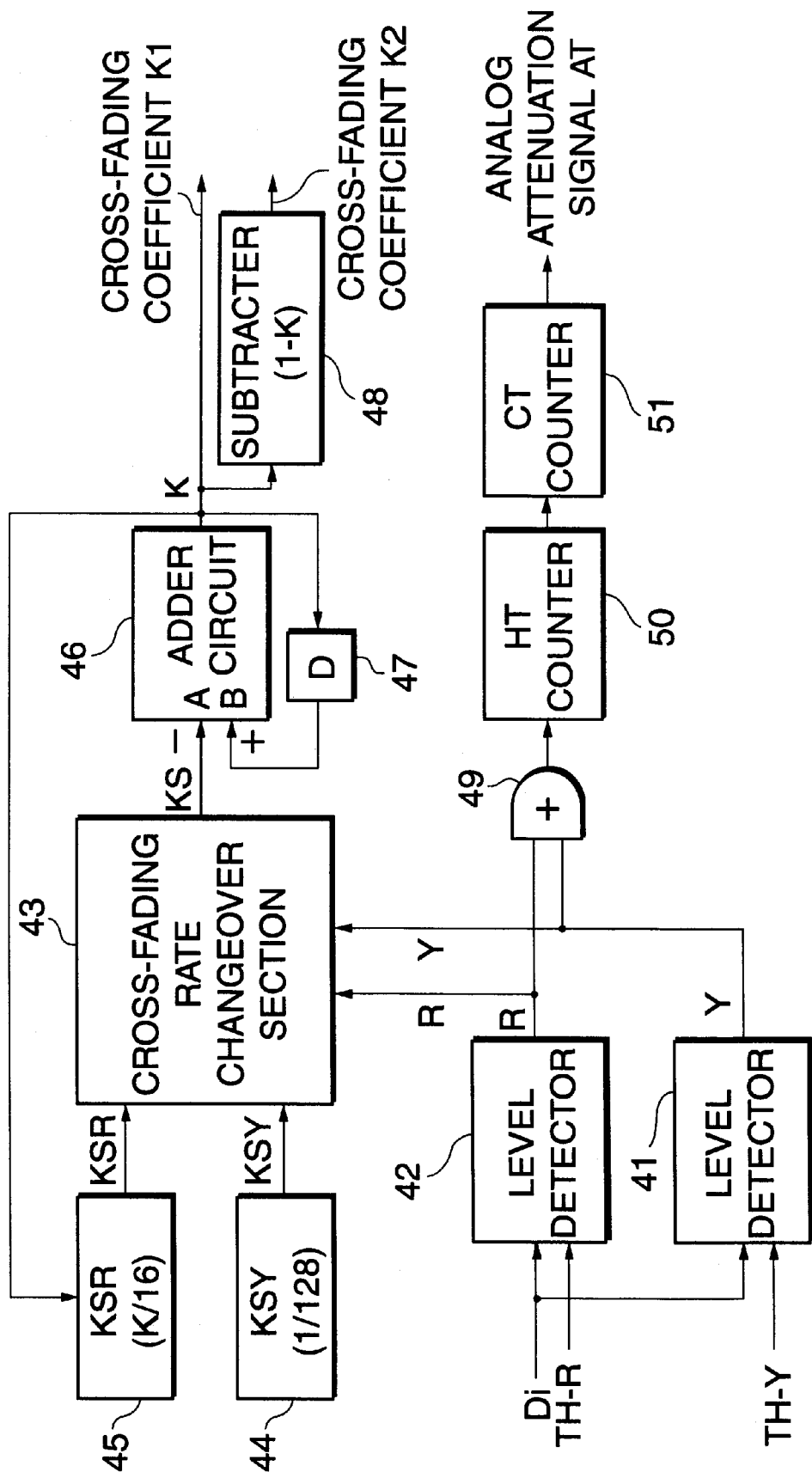
FIG. 4 is a block diagram showing the construction of a cross-fading control section within a DSP of the D/A conversion apparatus of FIG. 1.

FIG. 4 shows an example of the construction of the cross-fading control block 16 realizing the above described control operations.

The input digital data Di is input to level detectors 41, 42, where it is determined whether or not the amplitude level of the input digital data Di exceeds the first threshold value TH-Y and the second threshold value TH-R, respectively. A cross-fading rate changeover section 43 connected to the level detector 41, 42 is controlled by detection result signals Y, R delivered therefrom. The cross-fading rate changeover section 43 is also supplied with cross-fading rates KSY (1/128), KSR (K/16) from cross-fading rate supply section 44, 45. The cross-fading rate changeover section 43 selects the cross-fading rate KSY only when the detection result signal Y alone is made active, and selects the cross-fading rate KSR when the detection result signals Y. R are both made active. The cross-fading coefficient KS selected by the cross-fading switchover section 43 is input to a negative input terminal of an adder circuit 46 at a next stage. The adder circuit 46 has a positive input terminal thereof supplied with an output from a delay element 47 which delays an output from the adder circuit 46 by one sample. The adder circuit 46 generates a coefficient value K by cumulatively subtracting the cross-fading rate KS to generate a coefficient value K. The coefficient value K is directly output as the cross-fading coefficient K1, while at the same time, the same is subtracted from a value of 1 by a subtracter 48, and the resulting value is delivered as the cross-fading coefficient K2. It should be noted that the cross-fading rate supply section 45 is supplied with the output from the adder circuit 46, i.e. the coefficient value K, and calculates a value of K/16 based thereon to update the cross-fading rate KSR (=K/16).

The detection result signals Y, R from the level detectors 41, 42 are also supplied via an OR gate 49 to an HT counter 50. The HT counter 50 counts a time period over which the output R from the level detector 42 remains inactive, and when the count or measured time period exceeds the predetermined hold time HT, the HT counter 50 activates a cross-fading time (CT) counter 51 to start a counting operation. The CT counter 51 counts a cross-fading time over which the DAC 2 is switched to the DAC 1, and when the cross-fading time is counted up, it delivers the analog attenuation signal AT to the analog attenuator circuit 5.

Figure 5:
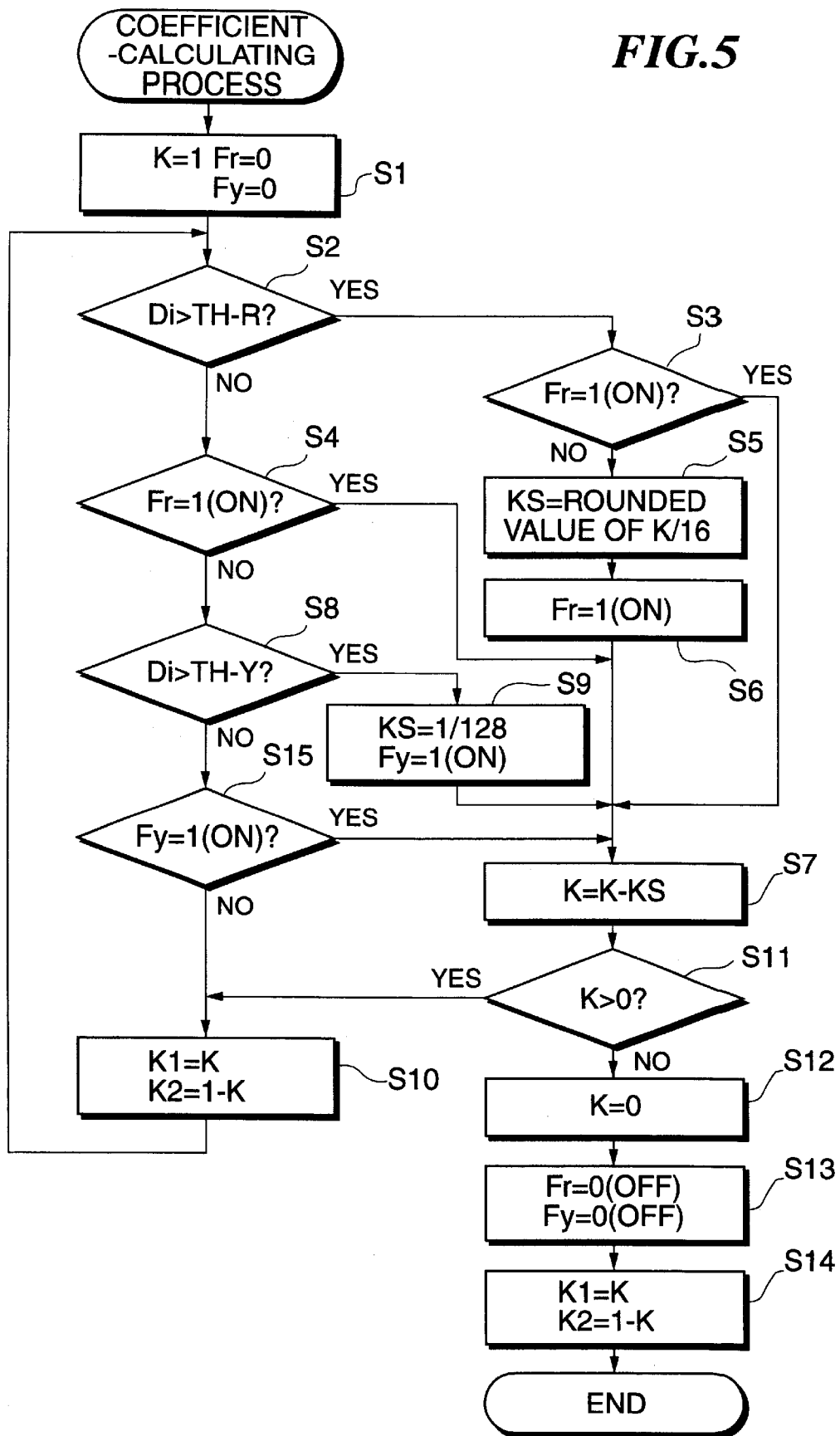
FIG. 5 is a flowchart showing a coefficient-calculating process executed by the cross-fading control section of the D/A conversion apparatus of FIG. 1.

To realize the above described cross-fading operation by software installed in the DSP 3, a coefficient-calculating process shown in FIG. 5 may be carried out. This process will now be described in detail.

When the input digital data Di is input to the level detectors 41, 42 of the DSP 3, first, at a step S1, the coefficient K is set to an initial value of 1, a 16-step coefficient flag Fr is reset to an initial value of 0, and a 128-step coefficient flag Fy is reset to an initial value of 0. It should be noted that the 16-step coefficient flag Fr is set to 0 before the cross-fading rate KS is switched from the value KSY to the value KSR, and to 1 after the switching, and the 128-step coefficient flag Fy is set to 0 before the cross-fading rate KS is switched from the value KSR to the value KSY, and to 1 after the switching.

(1) First, if the amplitude level of the input digital data Di is equal to or lower than the first threshold value TH-Y, it is determined at a step S2 that a condition of Di$\geq$TH-R holds, and the program proceeds to a step S4, wherein it is determined whether or not the 16-step coefficient flag Fr is ON (=1). In the present case, the flag Fr is OFF (i.e.=0) by the initialization of the process, so that the program proceeds to a step S8. If it is determined at the step S8 that a condition of Di$\leq$TH-Y holds, the program proceeds to a step S15, where it is determined whether or not the 128-step coefficient flag Fy is ON (=1). In the present case, the flag Fy is OFF by the initialization of the process, so that the program proceeds to a step S10, wherein the cross-fading coefficient K1 is set to K, while the cross-fading coefficient K2 is set to 1−K. Then, the program returns to the step S2, and this loop is repeatedly carried out and the cross-fading coefficients K1 and K2 remain 1 and 0, respectively.

(2) When the amplitude level of the input digital data Di exceeds the first threshold value TH-Y, it is determined at the step S8 that a condition of Di>TH-Y holds, and the program proceeds to a step S9, wherein the cross-fading rate KS is set to 1/128 per step and the 128-step coefficient flag Fy is set to 1 (ON). Then, the program proceeds to a step S7, wherein the coefficient K is updated to a value of K−KS, and it is determined at the following step S11 whether or not the coefficient K thus obtained is larger than 0. If the coefficient K is larger than 0, the program proceeds to the step S10, wherein the cross-fading coefficients are set as described above, thereby repeatedly carrying out the above process.

(3) When the amplitude level of the input digital data Di becomes larger than the second threshold value TH-R, the program proceeds from the step S2 to a step S3 to determine whether the 16-step coefficient flag Fr assumes a value of 1 (ON). When this step is first carried out, the 16-step coefficient flag Fr assumes a value of 0, and therefore the negative answer is obtained at the step S3, and hence the program proceeds to a step S5, wherein the cross-fading rate KS is changed to a rounded value of K/16. Further, at a step S6, the 16-step coefficient flag Fr is set to 1 (ON), and then the program proceeds to the step S7. Following the step S7, the process described above is repeatedly carried out to update the cross-fading coefficients K1 and K2 based on the cross-fading rate KS. The cross-fading coefficients K1 and K2 thus determined are delivered from the cross-fading control block 16 to the cross-faders 14 and 15, respectively, to be used in the cross-fading operation.

(4) Once the 16-step coefficient flag Fr is set to 1, the program proceeds to the coefficient-updating process of the step S7 from the step S3 if the input digital data Di is larger than the second threshold value TH-R, and from the step S4 if the input digital data Di is equal to or smaller than the second threshold value TH-R.

(5) Further, once the 128-step coefficient flag Fy is set to 1, the program proceeds to the coefficient-updating process of the step S7 from the step S9 if the input digital data Di is larger than the first threshold value TH-Y, and from the step S15 if the input digital data Di is equal to or smaller than the second threshold value TH-Y.

(6) If as a result of the coefficient-updating process the coefficient K becomes smaller than 0, the same is set to 0 at a step S12, and the 16-step coefficient flag Fr and the 128-step coefficient flag Fy are both set to 0 (OFF) at a step S13, and then, at the following step S14, the cross-fading coefficients K1 and K2 are set to K and 1−K, respectively, followed by terminating the program.

Figure 6:
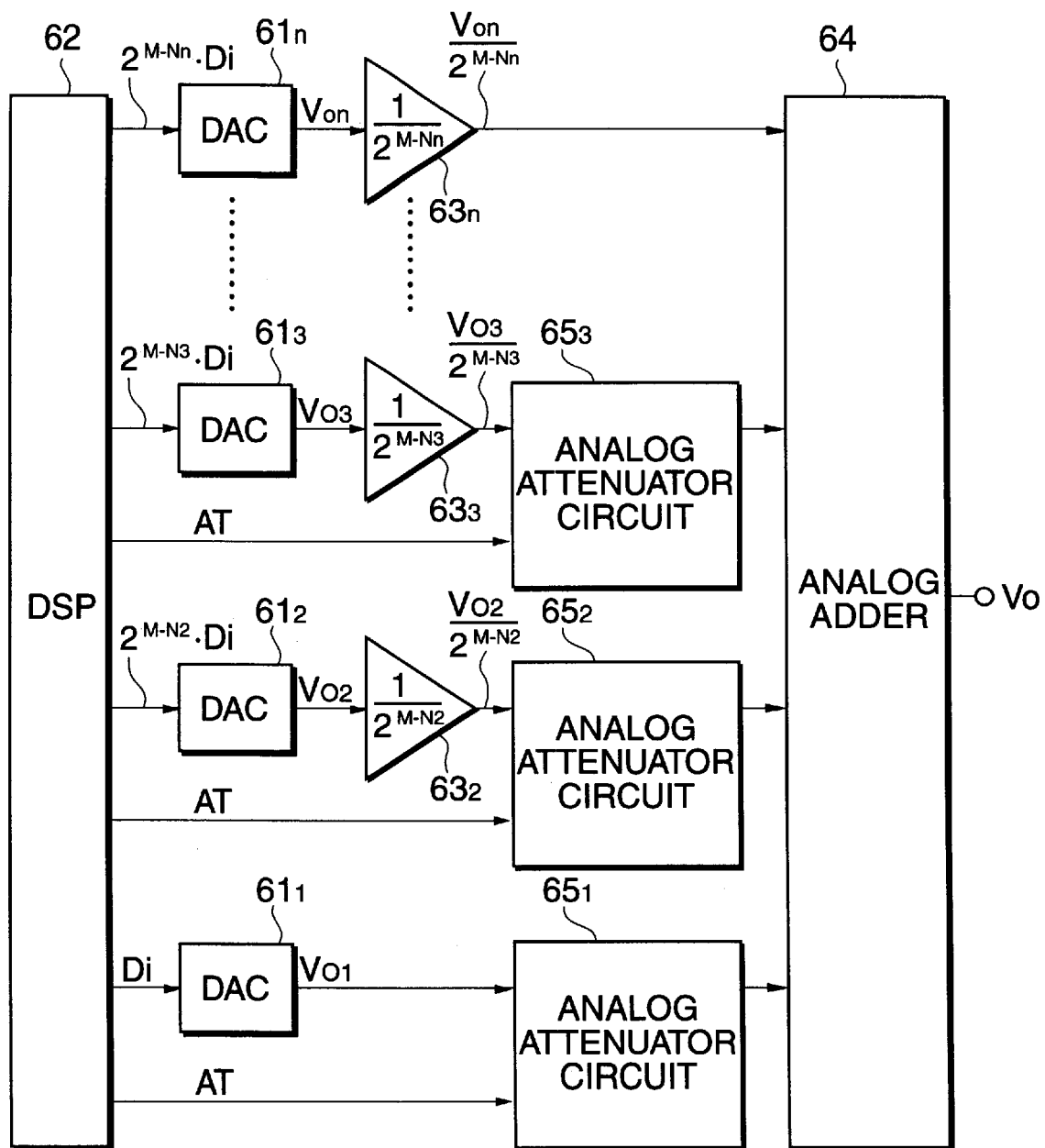
FIG. 6 is a circuit diagram showing the construction of a D/A converter according to another embodiment of the invention.

The present invention is by no means limited to the embodiment described above. Although in the above embodiment, only two channels of DAC's are employed, this is not limitative, but as shown in FIG. 6, this invention can be applied to an apparatus provided with a plurality of DAC's $61_1, 61_2, 61_3, \ldots, 61_n$. A DSP 62 multiplies the input digital data Di by factors of 1, $2^{M-N1}, \ldots 2^{M-Nn}$ (provided that $1 < 2^{M-N1} < \ldots < 2^{M-Nn}$) and selects only one of outputs from the DAC's $61_1$ to $61_n$ to be output, while digitally attenuating the unselected outputs. On the output side of each of the DAC's $61_2$ to $61_n'$, attenuators $63_2, 63_3, \ldots, 63_n$ are arranged for converting the amplitude level of the analog signals back to their original level. These outputs and an output from the DAC $61_1$ are added together by an analog adder 64 and the resulting signal is output.

In this arrangement as well, when the amplitude level of the input digital data Di is increasing, the currently selected DAC output is progressively and gently switched by cross-fading to another DAC output to be selected next, while changing the cross-fading rate in dependence on the magnitude of a change in the amplitude level of the input digital data. This makes it possible to reduce generation of noise while suppressing the amount of delay of data for processing.

Further, the amount of shift of (M−N) bits employed in the embodiment described above is not limitative, but any other suitable shift amount may be employed instead.

What is claimed is:

1. A D/A conversion apparatus comprising:

a digital signal processor that carries out level conversion of same input digital data by different conversion factors into a plurality of level-converted digital data, selects and outputs most appropriate data of the plurality of level-converted digital data based on a signal quality of each of said plurality of level-converted digital data, outputs other data of said plurality of level-converted digital data after attenuating the other data to or below a predetermined noise level, and switches between data previously selected as said most appropriate data and data newly selected as said most appropriate data by carrying out cross-fading between said previously selected data and said newly selected data, a plurality of D/A converters that carry out D/A conversion of said plurality of level-converted digital data output from said digital signal processor to respective analog signals and outputs said analog signals, and an analog adder device that carries out level conversion of said analog signals output from said plurality of D/A converters again based on respective corresponding ones of said conversion factors in a manner such that resulting analog signals have a level corresponding to a level of said input digital data, and then adds together all of the level-converted analog signals;

wherein said digital signal processor comprises:
  a cross-fading section that carries out cross-fading between said previously selected data and said newly selected data;
  a delay section that delays said input digital data by a predetermined amount of delay which is shorter than a time period required for completion of said cross-fading carried out at a predetermined cross-fading rate by said cross-fading section; and
  a cross-fading control section that controls said cross-fading section such that when an amplitude level of said input digital data exceeds a predetermined threshold value, said cross-fading section starts said cross-fading at said predetermined cross-fading rate between said previously selected data and said newly selected data which are delayed by said predetermined amount of delay by said delay section, and that when during said cross-fading a rate of change in said amplitude level of said input digital data, which is larger than a predetermined rate of change, is detected, said cross-fading section carries out said cross-fading at a cross-fading rate larger than said predetermined cross-fading rate in dependence on said rate of change in said amplitude level of said input digital data.

2. A D/A conversion apparatus comprising:

a digital signal processor that carries out level conversion of same input digital data by different conversion factors into a plurality of level-converted digital data, selects and outputs most appropriate data of the plurality of level-converted digital data based on a signal quality of each of said plurality of level-converted digital data, outputs other data of said plurality of level-converted digital data after attenuating the other data to or below a predetermined noise level, and switches between data previously selected as said most appropriate data and data newly selected as said most appropriate data by carrying out cross-fading between said previously selected data and said newly selected data, a plurality of D/A converters that carry out D/A conversion of said plurality of level-converted digital data output from said digital signal processor to respective analog signals and outputs said analog signals, and an analog adder device that carries out level conversion of said analog signals output from said plurality of D/A converters again based on respective corresponding ones of said conversion factors in a manner such that resulting analog signals have a level corresponding to a level of said input digital data, and then adds together all of the level-converted analog signals;

wherein said digital signal processor comprises:
  a cross-fading section that carries out cross-fading between said previously selected data and said newly selected data;
  a delay section that delays said input digital data by a predetermined amount of delay which is shorter than a time period required for completion of said cross-fading carried out at a first predetermined cross-fading rate by said cross-fading section; and
  a cross-fading control section that controls said cross-fading section such that when an amplitude level of said input digital data exceeds a first predetermined threshold value, said cross-fading section starts said cross-fading at said first predetermined cross-fading rate between said previously selected data and said newly selected data which are delayed by said predetermined amount of delay by said delay section, and that when during said cross-fading said amplitude level of said input digital data exceeds a second predetermined threshold value larger than said first predetermined threshold value, said cross-fading section carries out said cross-fading at a second predetermined cross-fading rate larger than said first predetermined cross-fading rate.

3. A D/A conversion apparatus according to claim 2, wherein said second predetermined threshold value is set to a limit of said amplitude level of said input digital data beyond which an overflow occurs when level conversion is carried out on said input digital data by a corresponding one of said different conversion factors, and said second cross-fading rate is set such that said cross-fading is completed in a time period corresponding to said predetermined amount of delay provided by said delay section.

4. A D/A conversion apparatus according to claim 2, wherein said cross-fading is carried out using a cross-fading coefficient, said time period required for completion of said cross-fading carried out at said first predetermined cross-fading rate is a time period required for processing of N1 samples of said input digital data, and said predetermined amount of delay provided by said delay section corresponds to a time period required for processing of N2 samples of said input digital data (N1>N2), and wherein said cross-fading coefficient is incremented/decremented by 1/N1 for each step of said cross-fading, after said amplitude level of said input digital data exceeds said first threshold value and before said amplitude level of said input digital data exceeds said second predetermined threshold value, and said cross-fading coefficient is incremented/decremented by (1−K)/N2 for each step of said cross-fading, after said amplitude level of said input digital data exceeds said second predetermined threshold value, wherein K represents a value of said cross-fading coefficient assumed at a time point said amplitude level of said input digital data exceeds said second threshold value.

5. A D/A conversion apparatus according to claim 3, wherein said cross-fading is carried out using a cross-fading coefficient, said time period required for completion of said cross-fading carried out at said first predetermined cross-fading rate is a time period required for processing of N1 samples of said input digital data, and said predetermined amount of delay provided by said delay section corresponds to a time period required for processing of N2 samples of said input digital data (N1>N2), and wherein said cross-fading coefficient is incremented/decremented by 1/N1 for each step of said cross-fading, after said amplitude level of said input digital data exceeds said first threshold value and before said amplitude level of said input digital data exceeds said second predetermined threshold value, and said cross-fading coefficient is incremented/decremented by (1−K)/N2 for each step of said cross-fading, after said amplitude level of said input digital data exceeds said second predetermined threshold value, wherein K represents a value of said cross-fading coefficient assumed at a time point said amplitude level of said input digital data exceeds said second threshold value.

6. A D/A conversion method comprising the steps of:

delaying input digital data by a predetermined amount of delay which is shorter than a time period required for completion of cross-fading carried out at a predetermined cross-fading rate;

carrying out level conversion of said delayed input digital data by different conversion factors into a plurality of level-converted digital data;

selecting and outputting most appropriate data of said plurality of level-converted digital data based on a signal quality of each of said plurality of level-converted digital data, and outputting other data of said plurality of level-converted digital data after attenuating said other data to or below a predetermined noise level;

switching between data previously selected as said most appropriate data of said plurality of level-converted digital data and data newly selected as said most appropriate data by carrying out said cross-fading between said previously selected data and said newly selected data;

carrying out D/A conversion of said plurality of level-converted digital data to respective analog signals and outputting said analog signals; and carrying out level conversion of said analog signals again based on respective corresponding ones of said conversion factors in a manner such that resulting analog signals have a level corresponding to a level of said input digital data, and then adding together all of the level-converted analog signals;

wherein when an amplitude level of said input digital data exceeds a predetermined threshold value, said cross-fading is started between said previously selected data and said newly selected data which are delayed by said predetermined amount of delay, and when during said cross-fading a rate of change in said amplitude level of said input digital data, which is larger than a predetermined rate of change, is detected, said cross-fading is carried out at a cross-fading rate larger than said predetermined cross-fading rate in dependence on said rate of change in said amplitude level of said input digital data.

7. A D/A conversion method comprising the steps of:

delaying input digital data by a predetermined amount of delay which is shorter than a time period required for completion of cross-fading carried out at a first predetermined cross-fading rate;

carrying out level conversion of said delayed input digital data by different conversion factors into a plurality of level-converted digital data;

selecting and outputting most appropriate data of said plurality of level-converted digital data based on a signal quality of each of said plurality of level-converted digital data, and outputting other data of said plurality of level-converted digital data after attenuating said other data to or below a predetermined noise level;

switching between data previously selected as said most appropriate data of said plurality of level-converted digital data and data newly selected as said most appropriate data by carrying out said cross-fading between said previously selected data and said newly selected data;

carrying out D/A conversion of said plurality of level-converted digital data to respective analog signals and outputting said analog signals; and carrying out level conversion of said analog signals again based on respective corresponding ones of said conversion factors in a manner such that resulting analog signals have a level corresponding to a level of said input digital data, and then adding together all of the level-converted analog signals;

wherein when an amplitude level of said input digital data exceeds a first predetermined threshold value, said cross-fading is started at said first predetermined cross-fading rate between said previously selected data and said newly selected data which are delayed by said predetermined amount of delay, and when during said cross-fading said amplitude level of said input digital data exceeds a second predetermined threshold value larger than said first predetermined threshold value, said cross-fading is carried out at a second predetermined cross-fading rate larger than said first predetermined cross-fading rate.

* * * * *